US007479474B2

(12) United States Patent
Cernat et al.

(10) Patent No.: US 7,479,474 B2
(45) Date of Patent: Jan. 20, 2009

(54) REDUCING OXIDE LOSS WHEN USING FLUORIDE CHEMISTRIES TO REMOVE POST-ETCH RESIDUES IN SEMICONDUCTOR PROCESSING

(75) Inventors: Mihaela Cernat, Brentwood, CA (US); Shihying Lee, Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 172 days.

(21) Appl. No.: 10/836,259

(22) Filed: May 3, 2004

(65) Prior Publication Data

US 2005/0245409 A1 Nov. 3, 2005

Related U.S. Application Data

(60) Provisional application No. 60/467,134, filed on May 2, 2003.

(51) Int. Cl.
C09K 13/08 (2006.01)
(52) U.S. Cl. .......................................... 510/175; 134/1.3
(58) Field of Classification Search ................. 510/175; 134/1.3
See application file for complete search history.

(56) References Cited

U.S. PATENT DOCUMENTS

| | | | | |
|---|---|---|---|---|
| 5,181,985 | A | | 1/1993 | Lampert et al. |
| 5,294,265 | A | * | 3/1994 | Gray et al. ................. 148/240 |
| 5,560,857 | A | | 10/1996 | Sakon et al. |
| 5,571,447 | A | * | 11/1996 | Ward et al. ................. 510/206 |
| 5,603,849 | A | | 2/1997 | Li |
| 5,645,737 | A | | 7/1997 | Robinson et al. |
| 5,653,823 | A | * | 8/1997 | McMillen et al. ........... 148/247 |
| 5,855,695 | A | * | 1/1999 | McMillen et al. ........... 148/247 |
| 5,858,282 | A | * | 1/1999 | Seiner et al. ............. 252/389.1 |
| 6,033,996 | A | | 3/2000 | Rath et al. |
| 6,248,704 | B1 | | 6/2001 | Small et al. |
| 6,312,812 | B1 | * | 11/2001 | Hauser et al. ............... 428/412 |
| 6,410,926 | B1 | * | 6/2002 | Munro et al. ............ 250/459.1 |
| 6,440,580 | B1 | * | 8/2002 | Berger et al. ................ 428/623 |
| 6,761,933 | B2 | * | 7/2004 | Warburton et al. .......... 427/410 |
| 6,777,034 | B2 | * | 8/2004 | Berger et al. ................ 427/410 |
| 6,828,289 | B2 | * | 12/2004 | Peters et al. ................. 510/175 |
| 2002/0151635 | A1 | * | 10/2002 | Gray et al. .................. 524/439 |
| 2003/0068498 | A1 | * | 4/2003 | Weller et al. ................ 428/416 |
| 2003/0078173 | A1 | | 4/2003 | Wojtczak et al. |
| 2004/0079647 | A1 | * | 4/2004 | Warburton et al. .......... 205/170 |
| 2005/0119143 | A1 | * | 6/2005 | Egbe et al. .................. 510/175 |

FOREIGN PATENT DOCUMENTS

WO WO2004/030038 4/2004

OTHER PUBLICATIONS

"Effects of Plasma Treatments on the Erosion of Teos-BPSG Films by Chemical Etchants" by C. Lee and S. Lee, Solid State Electronics, 1997 pp. 921-923.
"Applicability of HF Solutions for contact Hole Cleaning on Top of $TiSi_2$" by Baklanov et al, Electrochemical Society Proceedings, vol. 97-35, pp. 602-609 (1998).
Thin Solid Films by P. Ireland, 304, pp. 1-12 (1997).
"Cleaning of $CHF_3$ Plasma-Etched $SiO_2$/SiN/Cu Via Structures with Dilute Hydrofluoric Acid Solutions" by Ueno et al., J. Electrochem. Soc. vol. 144, Jul. 1997.

* cited by examiner

*Primary Examiner*—Gregory E Webb
(74) *Attorney, Agent, or Firm*—Morgan Lewis & Bockius LLP

(57) ABSTRACT

A novel cleaning composition used for post-etch resist residue removal is disclosed. In contrast to the conventional cleaning solutions based on fluoride chemistries, the present invention can significantly reduce the oxide loss resulting from the exfoliation, while still providing an excellent cleaning efficiency.

27 Claims, No Drawings

REDUCING OXIDE LOSS WHEN USING FLUORIDE CHEMISTRIES TO REMOVE POST-ETCH RESIDUES IN SEMICONDUCTOR PROCESSING

This application claims priority to U.S. Provisional Application No. 60/467,134 filed on May 2, 2003, the entire disclosure of which is incorporated herein by reference thereto for all purposes.

FIELD OF THE INVENTION

This invention is directed to a fluoride-based cleaning solution that can be effectively used for exfoliating post-etch residues, while reducing undesirable oxide loss associated with the cleaning process.

BACKGROUND OF THE INVENTION

Fluoride containing chemistries have been used for many years with prime silicon wafers in the semiconductor industry. Patents that teach methods for cleaning prime wafers with low pH solutions include U.S. Pat. Nos. 5,560,857; 5,645,737; 5,181,985; 5,603,849; and 5,705,089.

After the Front End of Line (FEOL) cleaning process the wafer proceeds to the typical Back End of Line (BEOL) manufacturing process for a semiconductor devices, in which the devices might be dynamic random access memories (DRAMs), static random access memories (SRAMs), logic, electrically programmable read only memories (EPROMs), complementary metal on silicon (CMOS), and the like. Etching fabrication technology using chemical reactions (liquid or plasma) has been used as a method of forming a wiring structure on such semiconductor substrates. Normally, dilute hydrofluoric acid is also used as the last process step in the sequence called "RCA rinses," to clean the substrate contaminated from previous process steps with metal, anions and/or organic residues. Using fluoride chemistries (usually HF) as a final RCA cleaning step will cause the silicon wafer surface to be in a hydrophobic state (the surface is covered with Si-H groups) which will repel water. During this step a certain proportion of the oxide surface is dissolved (removed). Unless the conditions are carefully monitored (time, temperature, solution composition) the substrates can be damaged.

A photoresist film is deposited on the wafer to form a mask, then a substrate design is imaged on the film layer, baked, and the undeveloped image is removed with a developer. The remaining image is then transferred to the underlying material through etching (either a dielectric or metal) with reactive etching gases promoted with plasma energy. The etchant gases selectively attack the unprotected area of the substrate. Liquid or wet etching chemistries have been used extensively over the years to etch metals, oxides and dielectrics. These chemistries provide aggressive isotropic etching (etching equally in all directions). Increasingly, plasma etching, reactive ion etching or ion milling are used, and such etching processes produce undesirable residues from the interaction of the plasma gases, reacted species and the photoresist. The composition of the resiudue is influenced by the type of etching, the resist, the underlying substrates, and the process conditions utilized.

If etching residue is not removed from the substrate, the residue can interfere with subsequent processes involving the substrate. The effect of poor cleaning results in low device yield, low device reliability, and low device performance.

To fulfill the demand for faster processing speed from semiconductor, the conventional Al or Al alloy used as the interconnection material has been replaced with Cu or Cu alloy, typically using a known damascene process. A barrier film, which may be silicon nitride, and a Low-k film are successively formed on the substrate, and a resist mask is then formed. The common low-K dielectrics include CORAL, tetraethylorthosilicate (TEOS), SiOC, porous MSQ, SiON, and boron phosphosilicate glass (BPSG). New low-k films having a lower dielectic constant than the p-TEOS film include a film formed of inorganic material such as porous silica or the like, a film formed organic material such as polyimide, polyarylene or the like, and a film formed of a mixture of the above-mentioned inorganic and organic materials. Next, the exposed low-k film is dry etched to expose the barrier film, so that a via hole is formed. At this time, reactive products of the gas used for the dry etching and the Low-k film and the resist film accumulate in the via hole as resist residue. Then, the resist film is removed by plasma ashing, leaving a modified film on the surface of Low-k film according to the reaction of the resist to heat and plasma during ashing. Then the resist residue is removed by processing with a fluoride-based cleaning composition. To ensure the removal of the resist residue, usually cleaning compositions have hydrofluoric acid that aggressively attacks the via sidewall of the dielectric and therefore changes the dimensions of the device, as taught by Ireland, P., Thin Solid Films, 304, pp. 1-12 (1997), and possibly the dielectric constant likely to evenly etch the insulating film has been used, and the via holes are enlarged. D. It is not uncommon for the HF to also attack the dielectric material. Such attack is not desirable (see Lee, C. and Lee, S., Solid State Electronics, 4, pp. 92 1-923 (1997)). Subsequently, a resist film patterned for trench formation is formed on the Low-k film, and, using the resist mask, the Low-k film is dry etched down to its intermediate position to form a trench. Resist residue that is the reactive product of the gas used for the dry etching and the Low-k film accumulates in the via hole and trench. The resist film is removed by plasma ashing, and resist residue is removed by processing with a conventional fluorine type compound-based cleaning composition. The conventional cleaning composition removes the resist residue and also etches the surface of the Low-k film, so that the internal diameter of via hole is further enlarged and the width of trench increases. Then, the barrier film, e.g., silicon nitride, is removed by dry etching to expose buried copper interconnections. Then, the surface of the copper interconnection is cleaned with a cleaning composition. In the conventional fluoride-based cleaning compositions, a copper corrosion inhibitor such as benzotriazole (BTA) has been added to prevent corrosion of the copper interconnection. With such a cleaning composition, however, there is a problem that the copper corrosion prevention interferes with attempts to improve the resist residue removing action. Finally, copper is filled in the via hole and trench by plating or the like.

The requirement for cleaning solutions that remove all types of residue generated as a result of plasma etching of various types of dielectrics and metals, such as aluminum, aluminum/silicon/copper, titanium, titanium nitride, titanium/tungsten, tungsten, silicon oxide, polysilicon crystal, etc., while not corroding or chemically altering the underlying dielectrics and often metals, presents a need for more effective chemistry in the processing area.

In addition, stripping compositions used for removing photoresist coatings and cleaning composition for removing post-etch residue have for the most part been highly flammable, generally hazardous to both humans and the environment, and comprise reactive solvent mixtures exhibiting an undesirable degree of toxicity. Moreover, these compositions are not only toxic, but their disposal is costly since they might have to be disposed of as a hazardous waste. In addition, these compositions generally have severely limited bath life and, for the most part, are not recyclable or reusable.

Numerous formulations have been described that purport to reduce oxide loss while maintaining cleaning ability. These compositions combine one or more of HF, ammonium fluoride, and or ammonium bifluoride as the fluoride source, in addition to water, organic solvents, and various additives. The mechanisms used to control corrosion and attack of dielectrics include reducing water content, reducing fluoride content (as HF) to less than 0.2%, usually less than 0.1%, and control the pH to be near neutral, e.g., between 4 and 10, usually between 5 and 9.

Water typically increases HF corrosion-: silica has an etch rate of 21 Å/min (@ 25° C.) in HF/water, but in HF/isobutanol the etch rate is only 2.1 Å/min, and in HF/acetone the etch rate is only 0.12 Å/min, as reported at NSF/SRC Eng. Res. Center, Environmentally Benign Semiconductor Manufacturing, Aug. 5-7, 1998, Stanford University. Several low-k materials can be altered by water. Polar organic solvents, typically amides, ethers, or mixtures thereof, can partially or completely reduce water. These solvents may be necessary for some substrates, but they are expensive and pose disposal problems.

Dilute compositions can lose effectiveness after repeated use, for example in baths. Recent information also indicates that the dilute HF solutions can be ineffective for cleaning the newer CFx etch residues, as taught by K. Ueno et al., "Cleaning of CHF3 Plasma-Etched SiO2/SiN/Cu Via Structures with Dilute Hydrofluoric Acid Solutions," J. Electrochem. Soc., vol. 144, (7) 1997. Contact holes opened on to the TiSi2 have also been difficult to clean with dilute HF solutions since there appears to be an attack of the underlying TiSi2 layer. There may also be difficulty with mass transport of the chemicals in the narrow hydrophilic contact holes, as taught by Baklanov, M. R. et al., Proc. Electrochem. Soc., 1998, 97-35, pp. 602-609.

Accordingly, there exists a need to develop improved cleaning compositions to efficiently clean a variety of deposits from a wide variety of substrates. Particularly in the field of integrated circuit fabrication, it should be recognized that the demands for improved cleaning performance with avoidance of attack on the substrates being cleaned are constantly increasing. This means that compositions that were suitable for cleaning less sophisticated integrated circuit substrates may not be able to produce satisfactory results with substrates containing more advanced integrated circuits in the process of fabrication. The cleaning compositions should also be economical, environmental friendly and easy to use.

SUMMARY OF THE INVENTION

In a first embodiment, the present invention relates to compositions capable of exfoliating post-etch residues and of minimizing oxide loss and including: (a) $H_2SiF_6$, $HBF_4$, or both; (b) an organic solvent; (c) optionally an amine; (d) a corrosion inhibitor; and (e) water, or in another embodiment a composition including: $H_2SiF_6$, water, and optionally a corrosion inhibitor. In preferred embodiments, the composition has $H_2SiF_6$, and the pH lower than 7.

In one embodiment, the composition contains: (a) $H_2SiF_6$, $HBF_4$, or both, at a total concentration from about 0.001% to about 5%, e.g., from about 0.3% to about 4%, by weight of the composition; (b) the organic solvent at a concentration from about 50% to about 98% by weight of the composition; (c) the amine at a concentration less than about 1.5% by weight of the composition; (d) the corrosion inhibitor at a concentration from about 0.001% to about 10% by weight of the composition; and (e) balance of water. In another embodiment, the composition contains: (a) $H_2SiF_6$, $HBF_4$, or both, at a total concentration from about 0.05% to about 3%, e.g., from about 0.5% to about 2%, by weight of the composition; (b) the organic solvent at a concentration from about 60% to about 95% by weight of the composition; (c) the amine at a concentration less than about 1% by weight of the composition; (d) the corrosion inhibitor at a concentration from about 0.05% to about 7% by weight of the composition; and (e) balance of water. In yet another embodiment, the composition contains: (a) $H_2SiF_6$, $HBF_4$, or both, at a total concentration from about 0.1% to about 2%, e.g., from about 0.7% to about 1.7%, by weight of the composition; (b) the organic solvent at a concentration from about 75% to about 95% by weight of the composition; (c) the amine at a concentration less than about 0.5% by weight of the composition; (d) the corrosion inhibitor at a concentration from about 0.1% to about 5% by weight of the composition; and (e) balance of water. Advantageously, in one embodiment, the pH of the composition can be from about 1 to about 6, alternately from about 1 to about 5.

In one embodiment, the composition contains: from about 0.001% to about 5%, e.g., from about 0.3% to about 4%, by weight of $H_2SiF_6$; optionally a corrosion inhibitor at a concentration from about 0.001% to about 10% by weight of the composition; and water. The amount of water is preferably at least about 90%, e.g, at least 98%, by weight. In another embodiment, the composition contains from about 0.5% to about 2%, by weight of $H_2SiF_6$ and from about 0.05% to about 7% by weight of the corrosion inhibitor. In yet another embodiment, the composition contains from about 0.7% to about 1.7% by weight $H_2SiF_6$.

Another aspect of the invention relates to a method of exfoliating post-etch resist residues using the compositions of the present invention. In a preferred embodiment, the method includes: providing a substrate with resist residues resulting from etching; contacting the substrate with a composition according to the invention for a time and at a temperature sufficient to cause the composition to substantially remove the resist residues; and optionally but preferably rinsing the substrate. The time can range from 5 seconds to 30 minutes and is typically 10 seconds to 15 minutes, the temperature can range from just above freezing temperature of the composition to the boiling temperature of the composition and is typically from ambient to about 40° C.

DETAILED DESCRIPTION OF THE PREFERRED EMBODIMENTS

Unless otherwise specified, all percentages expressed herein should be understood to refer to percentages by weight. Also, the term "about," when used in reference to a range of values, should be understood to refer to either value in the range, or to both values in the range.

The present invention is directed to a composition effective in post-etch resist residue removal comprising: (a) $H_2SiF_6$ or $HBF_4$; (b) an organic solvent; (c) optionally an amine; (d) a corrosion inhibitor; and (e) water. The pH of the composition is lower than 7.

In the composition of the present invention, a conventional fluoride compound typically included in the cleaning solution can advantageously be replaced with a fluoride compound comprising $H_2SiF_6$ and $HBF_4$. If the amount of $H_2SiF_6$ or $HBF_4$ contained in the composition is too low, the resist residue exfoliation power of the composition is too weak. Accordingly, in one preferred embodiment, the composition of the present invention contains H2SiF6 or HBF4 at a concentration from about 0.001% to about 5% by weight, preferably from about 0.005% to about 3% by weight, for example from about 0.01% to about 2.5% by weight, or from about 0.1% to about 2% by weight of the composition. In a more preferred embodiment, the composition of the present invention contains H2SiF6 at a concentration from about 0.3% to about 4% by weight, preferably from about 0.5% to about 2% by weight, for example from about 0.7% to about 1.7% by weight of the composition.

In one embodiment, the composition contains: from about 0.001% to about 5%, e.g., from, by weight of H2SiF6; optionally a corrosion inhibitor at a concentration from about 0.001% to about 10% by weight of the composition; and water. The amount of water is preferably at least about 90%, e.g, at least 98%, by weight. In another embodiment, the composition further contains from about 0.05% to about 7% by weight of the corrosion inhibitor.

In addition, many embodiments of the composition of the present invention can also contain an organic solvent. Examples of such organic solvents include, but are not limited to: amides such as N,N-dimethylformamide, N,N-dimethylacetaamide, N,N-diethylformamide, N,N-diethylacetamide, N-methylformamide, and N-methylacetamide; pyrrolidones such as N-methyl-2-pyrrolidone, N-ethyl-2-pyrrolidone, and N-hydroxyethyl-2-pyrrolidone; imidazolidinones such as 1,3-dimethy-2-imidazolidinone, and 1-3-diethyl-2-imidazolidinone; alkyl ureas such as tetramethyl urea, and tetraethyl urea; polyhydric alcohols and their derivatives such as ethylene glycol, ethylene glycol mono-methyl ether, ethylene glycol mono-ethyl ether, ethylene glycol mono-butyl ether, ethylene glycol mono-methyl ether acetate, ethylene glycol mono-ethyl ether acetate, diethylene glycol, diethylene glycol mono-methyl ether, diethylene glycol mono-ethyl ether, diethylene glycol mono-propyl ether, diethylene glycol mono-butyl ether, triethylene glycol mono-methyl ether, propylene glycol, propylene glycol mono-methyl ether, propylene glycol mono-ethyl ether, propylene glycol mono-butyl ether, dipropylene glycol mono-methyl ether, dipropylene glycol mono-ethyl ether, dipropylene glycol mono-propyl ether, dipropylene glycol mono-butyl ether, diethylene glycol dimethyl ether, diethylene glycol diethyl ether, diethylene glycol dipropyl ether, diethylene glycol diethyl ether, diethylene glycol dipropyl ether, diethyl glycol dibutyl ether, and triethylene glycol dimethyl ether; sulfoxides such as dimethyl sulfoxide, and diethyl sulfoxide; lactones such as γ-butyrolactone, and σ-valerolactone; oxycarbonic acid derivatives such as methyl lactate, ethyl lactate, propyl lactate, and butyl lactate; oxazolidinones such as 3-methyl-2-oxazolidinone and 3-ethyl-2-oxaxolidinone; and the like; and combinations thereof. Organic solvents, as used herein, should be understood to not encompass amines or water. Preferred organic solvents include an amide, an ether, or mixture thereof. The most preferred organic solvent is an amide, e.g., an N-alkyl-2-pyrrolidone.

In one preferred embodiment, the composition contains the organic solvent at a concentration from about 50% to about 98% by weight, preferably from about 60% to about 95% by weight, for example from about 75% to about 95% by weight, from about 70 to about 80% by weight, or from about of the composition.

Optionally, an amine can be included as a component of the present invention. As used herein, amines are not classified as organic solvents, as stated above. Examples of amine that may be useful for the composition according to the invention can include, but are not limited to: alkanolamines such as mono-, di-, and tri-isopropanolamine, 2-(2-aminoethylamino)-ethanol, 2-(2-aminoethoxy)-ethanol ("DGA"), 2-aminoethanol ("monoethanolamine" or "MEA"), 2-(N-methylamino) ethanol ("monomethyl ethanolamine" or "NMEA"), 2-amino-1-propanol ("monoisopropanolamine" or "MIPA"), 2-(N-hydroxyethyl-amino)-ethanol ("diethanolamine" or "DEA"), 2-[(2-aminoethyl)-(2-hydroxyethyl)-amino]-ethanol ("N,N-bis-hydroxyethyl-ethylenediamine"), N,N,N-tris-(2-hydroxyethyl)-ammonia ("triethanolamine" or "TEA"), N-aminoethyl-N'-hydroxyethyl-ethylenediamine, N,N'-dihydroxyethyl-ethylenediamine, 2-[2-(2-aminoethoxy)-ethylamino]-ethanol, 2-[2-(2-aminoethylamino)-ethoxy]-ethanol, 2-[2-(2-aminoethoxy)-ethoxy]-ethanol, tertiarybutyldiethanolamine, isopropanolamine, diisopropanolamine, 3-amino-1-propanol ("n-propanolamine" or "NPA"), isobutanolamine, 2-(2-aminoethoxy)-propanol, and the like, and combinations thereof; other alcohol-amines such as hydroxyaniline (e.g., 1-hydroxy-2-aminobenzene), hydroxylamine, hydroxylamine derivatives; and the like; and combinations thereof.

A preferred alkanolamine is a two carbon atom linkage alkanolamine. The generic two carbon atom linkage alkanolamine compounds suitable for inclusion in the invention have the structural formula N(X,Y)—C(R1, R1')-C(R2, R2')-Z-O—R3 wherein R1, R1', R2, R2', and R3 are, independently in each case, hydrogen or a linear, branched, or cyclic hydrocarbon containing from 1 to 7 carbon atoms; wherein Z is a group having the formula -(-Q-CR1R1'-CR2R2'-)m-, such that m is a whole number from 0 to 3 (i.e., when m=0, there is no atom between the —CR2 R2'- group and the —OR3 group in the formula above), R1, R1', R2, and R2' may be independently defined in each repeat unit, if m>1, within the parameters set forth for these moieties above, and Q may be independently defined in each repeat unit, if m>1, each Q being independently either —O— or —NR3-; and wherein X and Y are, independently in each case, hydrogen, a C1-C7 linear, branched, or cyclic hydrocarbon, or a group having the formula —CR1 R1'-CR2 R2'-Z-F, with F being either —O—R3 or —NR3R4, where R4 is defined similarly to R1, R1', R2, R2', and R3 above, and with Z, R1, R1', R2, R2', and R3 defined as above, or wherein X and Y are linked together form a nitrogen-containing heterocyclic C4-C7 ring.

In a preferred embodiment, the composition contains a two-carbon atom linkage alkanolamine compound, in which m is greater than or equal to 1. In another preferred embodiment, the composition contains a two-carbon atom linkage alkanolamine compound, in which m is 1 and R1, R1', R2, R2', and R3 are all hydrogen or a C1-C4 linear or branched hydrocarbon. In a more preferred embodiment, the composition contains a two-carbon atom linkage alkanolamine compound, in which: m is 1; R1, R1', R2, R2', and R3 are all hydrogen or a C1-C4 linear or branched hydrocarbon; and Q is —NR3. In a most preferred embodiment, the composition contains a two-carbon atom linkage alkanolamine compound, in which: m is 1; R1, R1', R2, R2', and R3 are all hydrogen; X and Y are, independently, hydrogen or a linear or branched C1-C4 hydrocarbon; and Q is —NH—, —NCH3-, or —N[(C2-C4) linear or branched hydrocarbon]-.

Hydroxylamines and hydroxylamine derivatives according to the invention can be characterized as having the following formula N(X,Y)—O—R3 wherein R3 is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen-containing heterocyclic C4-C7 ring. Preferably X, Y, and R3 are independently hydrogen or an alkyl containing from 1 to 2 carbon atoms.

Examples of derivatives of hydroxylamine according to the invention include, but are in no way limited to, hydroxylamine, N-methyl-hydroxylamine, N,N-dimethyl-hydroxylamine, N-ethyl-hydroxylamine, N,N-diethyl-hydroxylamine, methoxylamine, ethoxylamine, N-methyl-methoxylamine, and the like. As used herein, hydroxylamine is not an organic, and the boiling point and flash point of hydroxylamine and hydroxylamine derivatives is of no consequence to the formulation. It should be understood that hydroxylamine and its derivatives, as defined above, are available (and may be included in a composition according to the invention) as salts, e.g., sulfate salts, nitrate salts, or the like, or a combination thereof, and the invention includes these forms of hydroxylamine compounds and their derivatives. These salts greatly increase the theoretical flash point of hydroxylamine derivatives. Therefore, in another embodiment, the composition contains hydroxylamine, a sulfate or nitrate salt of hydroxylamine, or a combination thereof. Hydroxylamines are not desired in a subset of the formulations described herein. Therefore, in some embodiments, the composition according to the invention is substantially free from hydroxylamine and/or derivatives thereof. Additionally, hydroxylamine is commercially available in an aqueous, i.e., a 50% aqueous, solution. Hydroxylamine derivatives are typically available in more concentrated aqueous forms, for example 85% solutions with 15% water. However, hydroxylamine and/or hydroxylamine derivatives can be obtained or manufactured, in some instances and in some concentrations, in a water-free formulation.

In a preferred embodiment, the composition according to the invention contains water. Water is preferred in a majority of residue removing compositions, and in another embodiment, the composition is primarily, e.g., greater than 90%, water. As described above, in an alternate embodiment, the composition according to the invention is substantially free from water.

In one preferred embodiment, the concentration of the amine can be less than 1.5% by weight, preferably less than 1% by weight, for example less than 0.5% by weight of the composition. In another preferred embodiment, when present, the amine concentration can advantageously be from about 0.005% to about 1% by weight, preferably from about 0.01% to about 0.5% by weight, for example from about 0.05% to about 0.15% by weight, from about 0.1% to about 0.2% by weight, or of about 0.1% by weight of the composition.

The composition of the present invention can also advantageously contain a corrosion inhibitor as a component. Examples of corrosion inhibitors include, but are not limited to: nitrate salts of ammonium; hydrocarbon-substituted ammonium nitrate salts; benzotriazole; 2,4-pentandione dioxime; 1,6-dioxaspiro[4,4]nonane 2,7-dione (di-ether); thiourea; ammonium bisulfite; choline salts, e.g., bisulfite, nitrate, hydroxide, or the like, or a combination thereof; bischoline salts, e.g., bisulfite, nitrate, hydroxide, or the like, or a combination thereof; trischoline salts, e.g., bisulfite, nitrate, hydroxide, or the like, or a combination thereof; glycerol; sorbitol; gelatine; starch; phosphoric acid; silicic acid; polyethylene oxide; polyethylene imine; benzotriazole; gallic acid or gallic acid esters; glycolic acid or glycolic acid esters; sugar alcohols such as traitol, erythritol, adonitol, xylitol, teritol, idetol, and dulcitol; and the like; and combinations thereof.

In one preferred embodiment, the composition contains the corrosion inhibitor at a concentration from about 0.001% to about 10% by weight, preferably from about 0.05% to about 7% by weight, for example from about 0.1% to about 5% by weight, from about 0.05% to about 2% by weight, from about 4% to about 7% by weight, or from about 4.5% to about 5% by weight of the composition.

The pH of the present composition is lower than 8.5 and is typically lower than 7. In a preferred composition, the pH can be from about 1 to about 6, more preferably from about 1.9 to about 5.

When necessary or as desired, the pH can be adjusted by using pH adjusting agents including, but not limited to: inorganic acids such as sulfuric acid, nitric acid, hydrochloric acid, and phosphoric acid; organic acids such as acetic acid, propionic acid, oxalic acid, glycolic acid, and citric acid; ammonia or ammonium salts such as hydroxide; organic amines such as ethylenediamine and their respective ammonium salts; quaternary (e.g., C1-C10 hydrocarbon-substituted) ammonium bases; and the like; and combinations thereof (including pH buffers). The amount of said pH adjusting agent added can be readily determined by the persons of ordinary skill in the art according to the specific components of the composition. A preferred acidic pH adjusting agent is phosphoric acid.

A manufacturing method of a semiconductor device according to the present invention includes the step of forming a metal film having copper as its main component on a semiconductor substrate, the step of forming an insulating film such as a Low-k film thereon, the step of forming a resist film further thereon, the step of providing a hole or a trench in the insulating film by way of dry etching using the resist film as a mask, the step of removing the resist by gas plasma processing or heat treatment, and the step of removing, using the cleaning composition for removing resists as described above, resist residue generated due to reaction between etching gas and the resist film and the insulating film at the time of dry etching. The etching gas used in he present invention includes fluorocarbon as its main component, and the resist residue generated according to the reaction between the etching gas and the resist film and the insulating film such as the Low-k film includes resist residue, carbon residue and a composite thereof.

Another manufacturing method of a semiconductor device according to the present invention includes the step of forming a metal film having copper as its main component on a semiconductor substrate, the step of forming an insulating film such as a Low-k film thereon, the step of forming a resist film further thereon, the step of providing a hole or a trench in the insulating film by performing dry etching with the resist film as a mask, and the step of removing, using the cleaning composition for removing resists as described above, the remaining resist film and resist residue generated due to reaction between etching gas and the resist film and the insulating film at the time of dry etching.

The residue cleaning compositions of the present composition are generally effective in removing organometallic and selected metal oxide residue from a variety of integrated circuit constructs on substrates, e.g.: silicon; SiGe; Group III-V compounds, such as GaAs, GaP, InP, and the like; Group II-VI compounds, such as TeS; magnetic materials, such as NiFe; glasses, such as used, for example in flat panel or LC displays; or any combination thereof, especially those substrates including: metal and/or metal alloy layers, optionally with via holes features for interconnect, such as layers containing aluminum, titanium, copper, tantalum, and/or tungsten; oxide layers, such as silicon oxides; nitride layers, such as silicon nitride; oxynitride layers; silicones; polysilicones; and the like; and combinations thereof. The cleaning compositions of the present invention can also be effective in removing organometallic and metal oxide residue generated on the substrate of etching equipment utilized in the fabrication of integrated circuits. Examples of commercially available etching equipment include that available from Lam Research, Tegal, Electrotech, Applied Materials, Tokyo Electron, Hitachi, and the like.

Another aspect of the invention relates to a method of cleaning a substrate using the compositions of the present invention, which method involves contacting a substrate having organometallic and/or metal oxide residue thereon with a stripping and cleaning composition for a time and at a temperature sufficient to remove the residue. In one preferred embodiment, especially where the substrate is an oxide, nitride, or oxynitride, the residue can advantageously be removed with no observable etching to the substrate, i.e., with etch rates of about 1 angstrom or less per minute of immersion at the operating conditions.

In one embodiment, the substrate can be immersed in the composition according to the invention. In some cases, when a production line progress is temporarily interrupted, those substrates exposed to the residue removers of the present invention with the resultant very low etch rates can be salvaged, while those substrates immersed in more aggressive formulations are destroyed. In an alternate embodiment, the composition according to the invention can be applied to a surface of the substrate, e.g., by spraying on, applying droplets, coating, overcoating (with the excess composition running off the substrate), or the like, or a combination thereof.

There is no specific limit as to the time and temperature at which the composition of the present invention may be used in practice. For example, both the exfoliation time and exfoliation temperature can be readily determined by the persons of ordinary skill in the art based upon factors such as the condition of resist residues and specific components to be used in the composition.

This invention is also directed to a method of exfoliating the post-etch resist residues, comprising: providing a substrate with resist residues resulting from etching; contacting the substrate with the composition of the present invention for a time and at a temperature sufficient to cause the composition to substantially remove the resist residues; and rinsing the substrate.

The rinsing step can be carried out by using water soluble organic solvents, e.g. isopropanol, mixture of water soluble organic solvent and water, or using water only (e.g., extra pure, distilled-deionized, or double deionized water).

EXAMPLES

Certain embodiments of this invention, as well as certain advantages of this invention, are illustrated by the following non-limiting examples. Although limited number of examples are disclosed herein, it will be apparent to those skilled in the art that many modifications, both to materials and methods, may be practiced without departing from the purpose and interest of this invention.

Example 1

A composition A was prepared according to the ingredients in Table 1. The pH of the solution was about 1.9. TEOS (tetraethoxysilane) and AlCu substrates were etched with a chlorinated plasma in a commercially available etcher. The resulting metal wafers with residues were cut into small sample pieces, and then the sample pieces were immersed into the solution of Table 1 and were cleaned for about 5 minutes at about room temperature. The sample pieces were taken out, rinsed with deionized water and dried with the flow of $N_2$. SEM was performed with a Hitachi 4500 FE-SEM for evaluating cleaning and oxide loss. An excellent resist removal was observed. The observed oxide loss is summarized in Table 2.

TABLE 1

Composition A

| Component | Amount Used (grams) | Percent by Weight |
| --- | --- | --- |
| $H_2SiF_6$ | 1.4 | 1.5 |
| NMP | 75.5 | 79 |
| MEA | 0.1 | 0.1 |
| Xylitol | 4.7 | 4.9 |
| $H_2O$ | 13.9 | Balance |

TABLE 2

Observed Oxide Loss

| Sample | Thickness Before Treatment (Å) | Thickness After Treatment (Å) | Change (Å) |
| --- | --- | --- | --- |
| TEOS #1 | 3011 | 3008 | 3 |
| TEOS #2 | 3023 | 3019 | 4 |
| TEOS #3 | 2996 | 2990 | 6 |
| AlCu #1 | 5121 | 4222 | 899 |
| AlCu #2 | 5119 | 4212 | 907 |
| AlCu #3 | 5130 | 4219 | 911 |

Example 2

A composition B was prepared according to the ingredients in Table 3. The starting pH of the solution was 4.2. TEOS and AlCu substrates were etched with a chlorinated plasma in a commercially available etcher. The resulting metal wafers with residues were cut into small sample pieces, and then the sample pieces were immersed into the solution of Table 1 for cleaning for 24 hours at room temperature. The sample pieces were taken out, rinsed with deionized water and dried with the flow of $N_2$. SEM was performed with a Hitachi 4500 FE-SEM for evaluating cleaning and oxide loss. An excellent resist removal was observed. The observed oxide loss is summarized in Table 4.

TABLE 3

Composition B

| Component | Amount Used (grams) | Percent by Weight |
| --- | --- | --- |
| $H_2SiF_6$ | 0.2 | 0.25 |
| NMP | 75.5 | 76 |
| MEA | 0.1 | 0.1 |
| Xylitol | 4.7 | 4.7 |
| $H_2O$ | 18.7 | Balance |

TABLE 4

Observed Oxide Loss

| Sample | Thickness Before Treatment (Å) | Thickness After Treatment (Å) | Change (Å) |
| --- | --- | --- | --- |
| TEOS #1 | 3019 | 3016 | 3 |
| TEOS #2 | 3010 | 3006 | 4 |
| TEOS #3 | 2989 | 2988 | 1 |
| AlCu #1 | 5119 | 5024 | 95 |
| AlCu #2 | 5189 | 5085 | 104 |

TABLE 4-continued

Observed Oxide Loss

| Sample | Thickness Before Treatment (Å) | Thickness After Treatment (Å) | Change (Å) |
|---|---|---|---|
| AlCu #3 | 5145 | 5009 | 136 |

The TEOS (oxide) loss was very low, and metal loss was low, for the 24 hour period.

Examples 3-21

The compositions in Table 5 represent additional Examples according to the high-water embodiments of the present invention.

TABLE 5

| Example | parts $H_2SiF_6$ | parts water | pH | parts other components | etch rate (Å/min) |
|---|---|---|---|---|---|
| 3 | 0.24 | ~99 | 4.6 | 1 part xylitol; Ch(III) to adjust pH | ~47 (Al) ~13 (Cu) |
| 4 | 0.24 | ~99 | 4.6 | 1 part inositol Ch(III) to adjust pH | |
| 5 | 0.24 | ~99 | 4.6 | Ch(III) to adjust pH | |
| 6 | 0.24 | ~99 | 5.9 | 1 part xylitol Ch(III) to adjust pH | ~70 (Al) |
| 7 | 0.25 | ~98 | 5.2 | 1 part choline hydroxide | |
| 8 | 0.24 | ~99 | 1.4 | 0.25 parts $H_3PO_3$ | ~150 (Al) |
| 9 | 0.24 | ~99 | 1.1 | 0.75 parts $H_3PO_3$ | ~85 (Al) |
| 10 | 0.24 | ~99 | 5.5 | 0.75 parts $H_3PO_3$ Ch(III) to adjust pH | ~53 (Al) |
| 11 | 0.24 | ~99 | 1.3 | 1 part NTMPA | ~24 (Al) |
| 12 | 0.24 | ~99 | 5.2 | 1 part NTMPA TMAH to adjust pH | ~22 (Al) |
| 13 | 0.24 | ~99 | 5.6 | 1 part NTMPA TEA to adjust pH | ~15 (Al) |
| 14 | 0.25 | ~99 | 1.3 | 1.5 parts NTMPA | ~8.5 (Al) |
| 15 | 0.24 | ~99 | 1.4 | 1 part HPA | ~270 (Al) |
| 16 | 0.24 | ~99 | 5.4 | 1 part HPA Ch(III) to adjust pH | ~59 (Al) |
| 17 | 0.25 | ~99 | | 1 part sorbitol | |
| 18 | 0.25 | ~99 | | 2 parts sorbitol | |
| 18 | 0.25 | ~99 | | 5 parts sorbitol | |

* parts by weight of components in Table 5. Generally, when a composition is expressed in parts, the total number of parts is approximately 100 parts ± about 5 parts.
Ch(III) = tris-choline hydroxide;
NTMPA = 50% solution of nitrilotris(methylene phosphonic acid) in water;
TEA = triethylamine;
TMAH = tetramethylammonium hydroxide;
HPA = 50% solution of $H_3PO_2$ in water The compositions in Table 5 were useful in cleaning low-K material TEOS in a time of between 30 seconds and 1 minute. These compositions are preferred because the lack of solvents makes them environmentally friendly and low-cost, and there is no bath life stability issues. However, the amount of $H_2SiF_6$ is beneficially below 0.5%, for example between 0.15% and 0.4%, e.g., between 0.2% and 0.3%.

The high water embodiments are preferably substantially free of organic solvents, having less than 5%, preferably less than 1%, more preferably no organic solvents. A preferred high-water embodiment was example Example 3, having a small amount of xylitol. Adding 45 parts ethylene glycol or 75 parts ethylene glycol to 100 parts of the composition of Example 3 did not reduce aluminum corrosion, but actually increased the corrosion of aluminum a small amount.

Adding acid to get to pH of below 1.5 significantly increased aluminum corrosion. Increasing the pH to with corrosion inhibitors like choline did not significantly protect the aluminum, but could ameliorate the affect of added phosphoric and/or phosphorous acid. An easier component to adjust pH was TMAH and TEA, and surprisingly, when the pH was adjusted to between 5 and 6 with either of these compounds the corrosion of aluminum was significantly reduced. Phosphonate-based corrosion inhibitors (e.g., nitrilotris(methylene phosphonic acid) are effective at cutting metal corrosion in amounts below 0.5% even at very low (e.g., less than 1.5) pH values.

The compositions of Examples 3 to 18 can be used for single wafer cleaning applications, as they have been shown to exhibit a low TEOS etch rate and an acceptable Cu etch rate, cleaning times less than 1 minute, while being relatively environmentally friendly, relatively low cost, and relatively stable. In addition, these compositions may optionally include organic solvents, e.g., ethylene glycol, to augment resist-cleaning capability.

The above examples are not limiting but are merely illustrative of certain preferred aspects of the invention.

What is claimed is:

1. A method of cleaning etching residue from a substrate comprising a low k dielectric material comprising the steps of:
    contacting the substrate comprising a low k dielectric material with a composition comprising: (a) $H_2SiF_6$; (b) an organic solvent; (c) an amine; (d) a corrosion inhibitor; and (e) water, wherein said composition is capable of exfoliating post-etch residues and of minimizing oxide loss, and wherein the composition has a pH lower than 7, for a time and at a temperature sufficient to cause the composition to substantially remove the residues.

2. The method of claim 1, wherein the composition comprises: (a) $H_2SiF_6$ at a concentration from about 0.001% to about 5% by weight of the composition; (b) the organic solvent at a concentration from about 50% to about 98% by weight of the composition; (c) the amine at a concentration less than about 1.5% by weight of the composition; (d) the corrosion inhibitor at a concentration from about 0.001% to about 10% by weight of the composition; and (e) balance of water.

3. The method of claim 1, wherein the composition comprises: (a) $H_2SiF_6$ at a concentration from about 0.05% to about 3% by weight of the composition; (b) the organic solvent at a concentration from about 60% to about 95% by weight of the composition; (c) the amine at a concentration less than about 1% by weight of the composition; (d) the corrosion inhibitor at a concentration from about 0.05% to about 7% by weight of the composition; and (e) balance of water.

4. The method of claim 1, wherein the composition comprises: (a) $H_2SiF_6$ at a concentration from about 0.1% to about 2% by weight of the composition; (b) the organic solvent at a concentration from about 75% to about 95% by weight of the composition; (c) the amine at a concentration less than about 0.5% by weight of the composition; (d) the corrosion inhibitor at a concentration from about 0.1% to about 5% by weight of the composition; and (e) balance of water.

5. The method of claim 1, wherein the pH of the composition is from about 1 to about 7.

6. The method of claim 1, wherein the pH of the composition is from about 3 to about 6.

7. The method of claim 1 further comprising the step of rinsing the substrate.

8. The method of claim 1 wherein the composition comprises from about 0.3% to about 4% of $H_2SiF_6$.

9. The method of claim 1 wherein the composition comprises from about 0.2% to about 2% of $H_2SiF_6$.

10. A method of cleaning etching residue from a substrate comprising a low k dielectric material comprising the steps of:
contacting the substrate comprising a low k dielectric material with a composition comprising: (a) $H_2SiF_6$; and (b) greater than 90% water wherein said composition is capable of exfoliating post-etch residues and of minimizing oxide loss, and wherein the composition has a pH lower than 7, for a time and at a temperature sufficient to cause the composition to substantially remove the residues.

11. The method of claim 10, wherein the composition further comprises (c) a corrosion inhibitor.

12. The method of claim 10, wherein the composition further comprises (d) an organic solvent.

13. The method of claim 12, wherein component (a) is present at a concentration from about 0.1% to about 2% by weight of the composition, (c) is present at a concentration from about 0.1% to about 5% by weight of the composition, and (d) is present at a concentration less than 5% by weight of the composition.

14. The method of claim 13, wherein (d) is present at a concentration less than 1% by weight of the composition and wherein the pH of the composition is from about 1 to about 6.

15. The method of claim 10, wherein the pH of the composition is from about 1 to about 6 and wherein the composition is free of organic solvents.

16. The method of claim 10, further comprising the step of rinsing the substrate.

17. A method of cleaning etching residue from a substrate comprising a low k dielectric material comprising the steps of:
contacting the substrate comprising a low k dielectric material with a composition comprising: (a) $H_2SiF_6$; (b) water; and (c) a corrosion inhibitor, wherein said composition is capable of exfoliating post-etch residues and of minimizing oxide loss, and wherein the composition has a pH of 5 or greater but lower than 7, for a time and at a temperature sufficient to cause the composition to substantially remove the residues.

18. The method of claim 17, wherein the corrosion inhibitor is a polysaccharide.

19. The method of claim 17, wherein the corrosion inhibitor is selected from the group consisting of xylitol, sorbitol, and inositol.

20. The method of claim 17, wherein the corrosion inhibitor is an organic phosphonate.

21. The method of claim 17, wherein the corrosion inhibitor is nitrilotris(methylene phosphonic acid).

22. The method of claim 17, wherein the corrosion inhibitor is choline hydroxide, tris-choline hydroxide, or a combination thereof.

23. The method of claim 17, wherein the pH is between 5 and about 6.

24. The method of claim 17, wherein the composition is substantially free of organic solvents.

25. The method of claim 17, wherein the composition consists essentially of (a) $H_2SiF_6$; (b) water; and (c) a corrosion inhibitor.

26. The composition of claim 17, wherein the $H_2SiF_6$ is present in an amount from about 0.2% to about 0.3% by weight.

27. A method of cleaning etching residue from a substrate comprising a low k dielectric material comprising the steps of:
contacting the substrate with a composition comprising: (a) $HBF_4$ or $H_2SiF_6$; (b) greater than 90% water, wherein said composition is capable of exfoliating post-etch residues and of minimizing oxide loss, and wherein the composition has a pH lower than 7, for a time and at a temperature sufficient to cause the composition to substantially remove the residues.

* * * * *